(12) United States Patent
Mueller

(10) Patent No.: US 7,602,106 B2
(45) Date of Patent: Oct. 13, 2009

(54) PIEZOELECTRIC DEVICE PACKAGE AND METHOD FOR DOWNHOLE APPLICATIONS

(76) Inventor: Timothy J. Mueller, 710 Century Pkwy., Allen, TX (US) 75013

( * ) Notice: Subject to any disclaimer, the term of this patent is extended or adjusted under 35 U.S.C. 154(b) by 0 days.

(21) Appl. No.: 12/208,154

(22) Filed: Sep. 10, 2008

(65) Prior Publication Data

US 2009/0051246 A1    Feb. 26, 2009

Related U.S. Application Data

(63) Continuation-in-part of application No. 11/844,041, filed on Aug. 23, 2007.

(51) Int. Cl.
*H01L 41/08* (2006.01)
(52) U.S. Cl. .................... 310/344; 310/313 R
(58) Field of Classification Search ............ 310/313 R, 310/344, 348
See application file for complete search history.

(56) References Cited

U.S. PATENT DOCUMENTS

| | | | |
|---|---|---|---|
| 3,981,011 A * | 9/1976 | Bell, III ................... 342/44 |
| 5,438,305 A * | 8/1995 | Hikita et al. ................ 333/32 |
| 7,289,008 B2 * | 10/2007 | Kuroki et al. .............. 333/133 |
| 7,479,846 B2 * | 1/2009 | Inoue et al. ................ 333/133 |
| 2005/0237130 A1 * | 10/2005 | Iwamoto et al. ........... 333/133 |
| 2006/0066419 A1 * | 3/2006 | Iwaki et al. ............... 333/133 |
| 2007/0023185 A1 | 2/2007 | Hall et al. ................ 166/255.1 |
| 2008/0225376 A1 * | 9/2008 | Kim .......................... 359/287 |

* cited by examiner

*Primary Examiner*—Mark Budd
(74) *Attorney, Agent, or Firm*—Michael A. O'Neil

(57) ABSTRACT

A new and improved piezoelectric device package that can withstand pressures of at least 25,000 psi, high temperatures of at least 300° C., as well as acidic and caustic environments, such as often encountered in oil and gas wells. The package is comprised of a hermetically sealed piezoelectric device header with an internal cavity for mounting various types of piezoelectric devices, an impedance matching network, an antenna, and a protective radome outer cover. The internal structure of the device package is for the most part solid with the exception of an approximate 1-micron space above the surface of the piezoelectric device to allow acoustic waves a path to travel. The general shape of the piezoelectric device package is typically that of a round disk that can be installed and secured by attaching fingers or other means in a bored cavity of a tool, pipe, or other piece of equipment.

4 Claims, 4 Drawing Sheets

PIEZOELECTRIC DEVICE PACKAGE AND METHOD FOR DOWNHOLE APPLICATIONS

CROSS-REFERENCE TO RELATED APPLICATION

This application is a continuation-in-part patent application of U.S. patent application Ser. No. 11/844,041 filed Aug. 23, 2007, currently pending, the entire contents of which are incorporated herein by reference.

DETAILED DESCRIPTION

Figure 1:
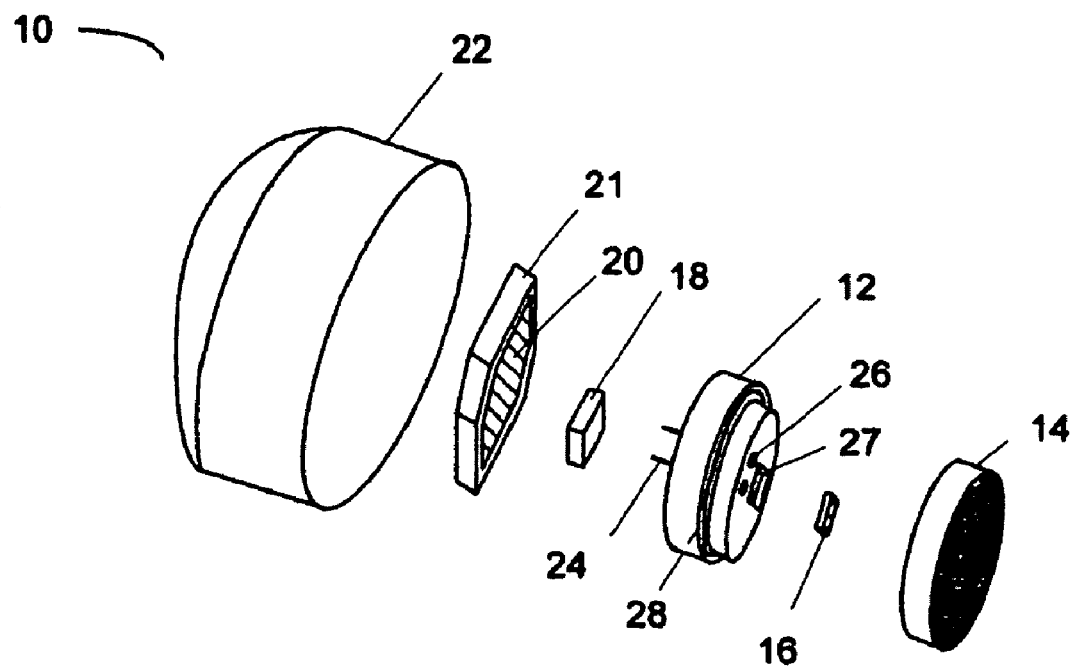
FIG. 1 is a breakaway drawing showing the buildup of the individual components for the preferred embodiment of a high pressure piezoelectric device package comprising an embodiment of the invention.

A piezoelectric device package 10 comprising an embodiment of the invention for use in high pressure applications is illustrated in FIG. 1. The piezoelectric package 10 is constructed of materials of sufficient strength and composition to withstand pressures of at least 25,000 psi, high temperatures of at least 300° C., and acidic and caustic environments. In one embodiment of the invention the piezoelectric device package 10 is comprised of a piezoelectric device header 12 having an internal cavity 27 for mounting a piezoelectric device 16 with a bottom lid 14 hermetically sealed to the bottom of the device header, an impedance matching device 18, an antenna 20, and a protective radome outer cover 22. In an embodiment of the invention the internal structure of the device package 10 is entirely solid with the exception of a cavity 27 for mounting and connecting the piezoelectric device 16 and other associated components. The device header 12 may have two or more header electrodes 24 extending through glass-to-metal seals 26 for connecting the device through an impedance matching network 18 and in turn to an antenna 20. In one embodiment of the invention the shape of the piezoelectric device package 10 is a round disk with only enough internal open space to allow at least a 1-micron air gap on top of the piezoelectric die which provides a path for acoustic waves to travel, it being understood by those skilled in the art that other shapes can also be used. The piezoelectric header 12 has a hermetic sealing surface or ring 28 for attaching a bottom lid 14.

The piezoelectric device package 10 facilitates the use of various types of RF antennas 20 typically associated with different types of piezoelectric devices. Suitable antennas include, but are not limited to: ceramic patch antennas, flat panel antennas, monopole antennas, dipole antennas, c-slot antennas, e-slot antennas, microchip antennas, patch antennas, choke ring antennas, etc. The antenna is preferably of sufficient size to allow for electromagnetic energy to be radiated in the direction of the top of the radome 22. The structure of the antenna in one embodiment of the invention is a patch antenna 20 mated to a ceramic substrate backing 21 comprising a size and a dielectric material that optimizes the radiated frequency. The patch antenna 20 is further constructed of a conductive material and mounted on the ceramic substrate backing 21 having sufficient dielectric constant to maximize transmission of the frequency of interest. The patch antenna may be square in shape with alterations as needed to allow for different orientations of the overall package. The size of the antenna allows for it to be completely encased inside the radome 22 and of proper size to match the required frequency of a particular application. Antenna substrate materials other than dielectric ceramics can be used depending on the selected piezoelectric device and antenna chosen for a particular application.

In accordance with an embodiment of the invention the piezoelectric device package 10 may include an impedance matching network 18 for connecting the piezoelectric device 16 and the antenna 20 together for optimized performance. The impedance matching network is designed to allow for maximum radiation when the piezoelectric device and the antenna are combined. Some of the optimized frequencies of such devices include, but are not limited to, 434 MHz, 915 MHz, 2.4 GHz, and 5.8 GHz. In one embodiment of the invention the impedance matching network is a separate component but is included in the antenna 20.

In accordance with an embodiment of the invention the protective radome 22 combines the piezoelectric device header 12, the impedance matching network 18, and the antenna 20 in a single, hermetically sealed package. All three components must survive high pressure and high temperature, both individually and collectively. The radome construction has an outer protective case made of 304L stainless steel or an equivalent material into which the housing and antenna are inserted. A composite material, such as polyetheretherketone or polyimide thermoplastic resins, that is RF transparent and resistant to heat, pressure, and acid/caustic environments is machined or molded in the top outer protective case over the RF components to allow RF signals to enter and exit the package. The radome case may incorporate a tapered edge to allow for a friction fit into a cavity and thereafter secured indefinitely. The top surface of the radome can be flat or shaped to match the contour of the tool in which the piezoelectric package is being mounted. Mounting the radome into a cavity can be achieved in a multitude of ways including, but not limited to, integral retaining rings, retaining fingers or exterior retaining devices.

Figure 2:
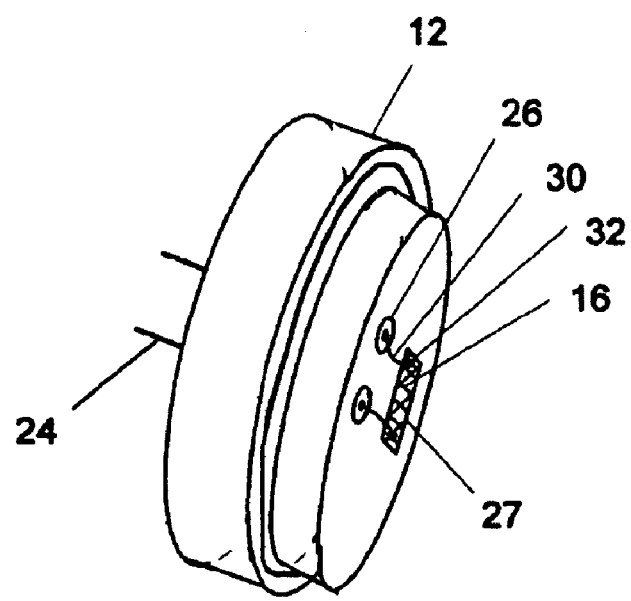
FIG. 2 is a perspective view of the piezoelectric device header comprising an embodiment of the invention.

FIG. 2 is a perspective view of the piezoelectric device header 12 comprising an embodiment of the invention. The device header cavity 27 may be constructed in a size and shape that accommodates a particular piezoelectric device. The device header 12 may be constructed of materials such as 41/40 stainless steel, nickel metal alloys, or other similar materials to allow for the complete protection of the piezoelectric device from exposure to high pressure, high temperature, and also acidic and caustic environments including oil, gas, water, salt water, hydrogen sulfide, bromides, chlorides, and other completion fluids. The device header 12 further has at least two electrodes 24 extending from the top side and sealed with a glass-to-metal seal 26 into an area adjacent the cavity 27 to further prevent intrusion into the package. A piezoelectric device 16 may be mounted in a cavity of the header 12 with bonding wires 30 attached between bonding pads 32 and leads extending through the glass-to-metal seals 26 and exiting the top of the header by means of electrodes 24. The device header 12 can accommodate any of the various types of radio frequency (RF) piezoelectric devices 16, such as radio frequency identification (RFID) surface acoustic wave (SAW) devices and bulk acoustic wave (BAW) devices.

Figure 3:
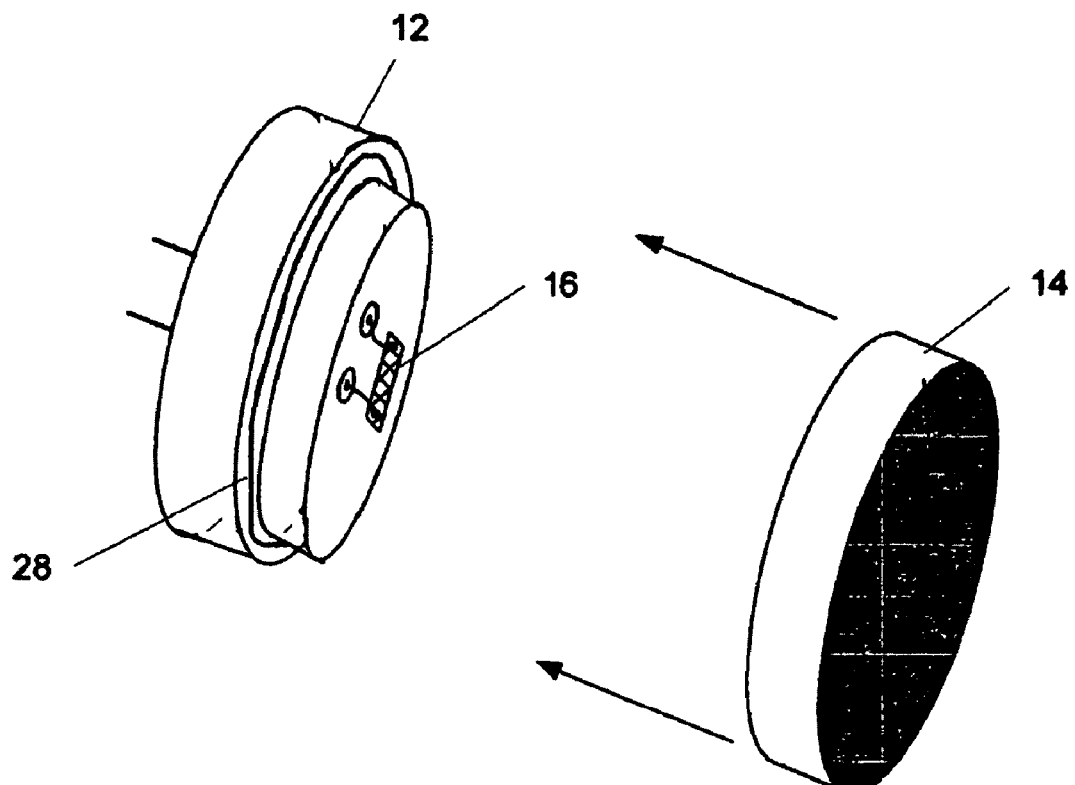
FIG. 3 is a drawing illustrating the attachment of a hermetically sealed bottom lid to a high pressure piezoelectric device header comprising an embodiment of the invention.

FIG. 3 illustrates an embodiment of the invention in which a bottom lid 14 is hermetically sealed to the high pressure piezoelectric device header 12, with the piezoelectric device 16 attached, to prevent the intrusion of any outside substances into the device header. The technique used to hermetically seal the bottom lid 14 to the piezoelectric device header 12 may consist of various high pressure and high temperatures techniques used in electronic packaging. Other sealing methods including electron beam welding, resistance welding and the use of high temperature solder and epoxy rings 28 can also be used for reliably sealing the bottom lid 14 to the piezoelectric device header 12.

Figure 4:
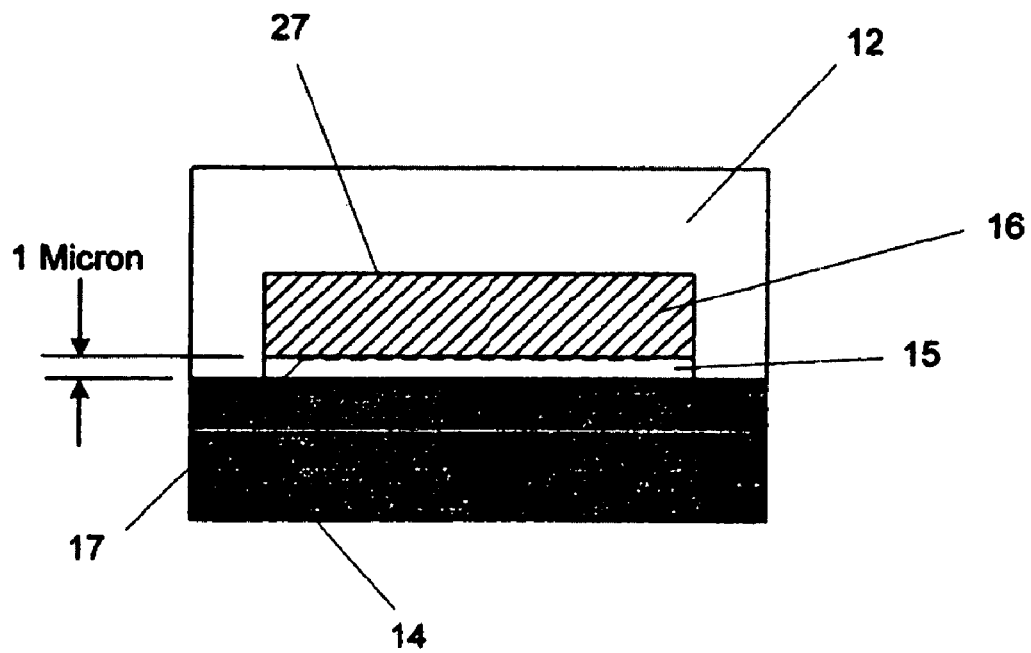
FIG. 4 is a cross sectional drawing illustrating a 1-micron gap over the surface of a surface acoustic wave (SAW) piezoelectric device installed in a high pressure piezoelectric device package in accordance with an embodiment of the invention.

FIG. 4 is a cross sectional view of the piezoelectric device header 12 and the attached bottom lid 14. A surface acoustic wave (SAW) device 16 with its interdigital transducers 17 is mounted in the cavity 27 of the piezoelectric header 12 with a 1-micron gap 15 over the surface of a SAW device to provide a path for the acoustic waves to travel. This small gap over the surface of the SAW devise is the only void space inside the final header package, thereby providing a higher pressure environment for piezoelectric devices.

Figure 5A:
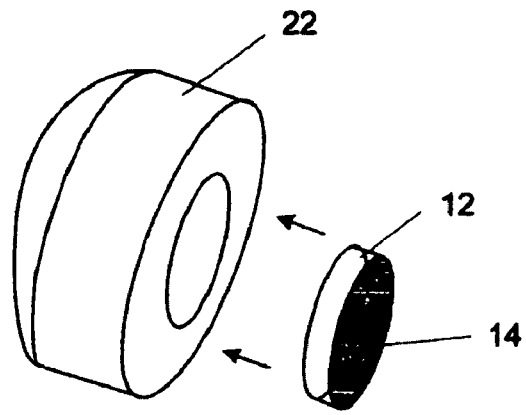
FIG. 5a is a perspective view illustrating a piezoelectric device header being installed in the high pressure outer radome of the piezoelectric device package in accordance with an embodiment of the invention.

FIG. 5a is a perspective view of an embodiment of the invention wherein a piezoelectric device header 12, which contains a piezoelectric device, and a hermetically sealed bottom cap 14 installed into a high pressure outer radome 22.

Figure 5B:
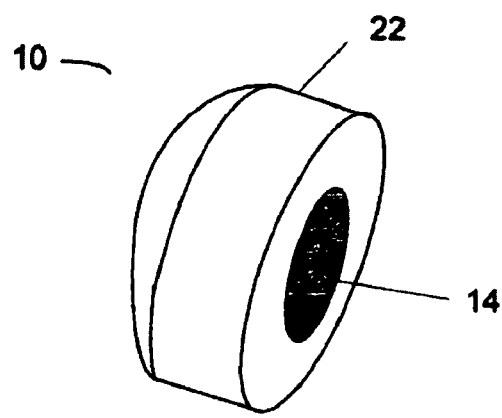
FIG. 5b is a perspective view of the high pressure piezoelectric device package, which includes a piezoelectric device mounted in a header, an impedance matching network, an antenna, and an outer radome protective cover in accordance with an embodiment of the invention.

FIG. 5b is a perspective view of an embodiment of the invention comprising a complete high pressure piezoelectric device package 10 including a piezoelectric device header, an impedance matching network, an antenna, and an outer radome protective cover 22. F*igure* 5b shows the bottom cap 14 of the piezoelectric header comprising an integral part of the piezoelectric device package 10.

Figure 6:
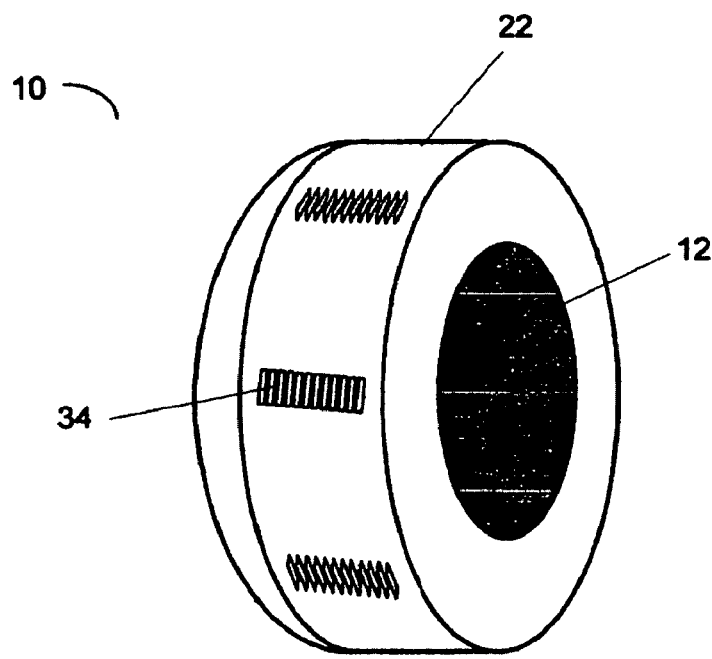
FIG. 6 is perspective view of the high pressure piezoelectric device package illustrating an arrangement of retaining fingers on the outer surface of the radome of the high pressure piezoelectric device package for securing the package in a mating cavity located in a piece of equipment or pipe to be tagged in accordance with an embodiment of the invention.

FIG. 6 is perspective view of a high pressure piezoelectric device package comprising an embodiment of the invention showing a series of retaining fingers 34 along the outer perimeter of the outer radome protective cover 22 of the high pressure piezoelectric device package 10 with piezoelectric device header 12 for securing the package in a mating cavity located in a piece of equipment or pipe being tagged. Although the radome protective cover 22 can incorporate a tapered edge to assist in installing the package into a tool cavity and provide a friction fit to secure it in place, other means, such as the retaining fingers 34 shown, retaining rings, and other available securing means can be used to help secure the mounted device indefinitely.

Figure 7:
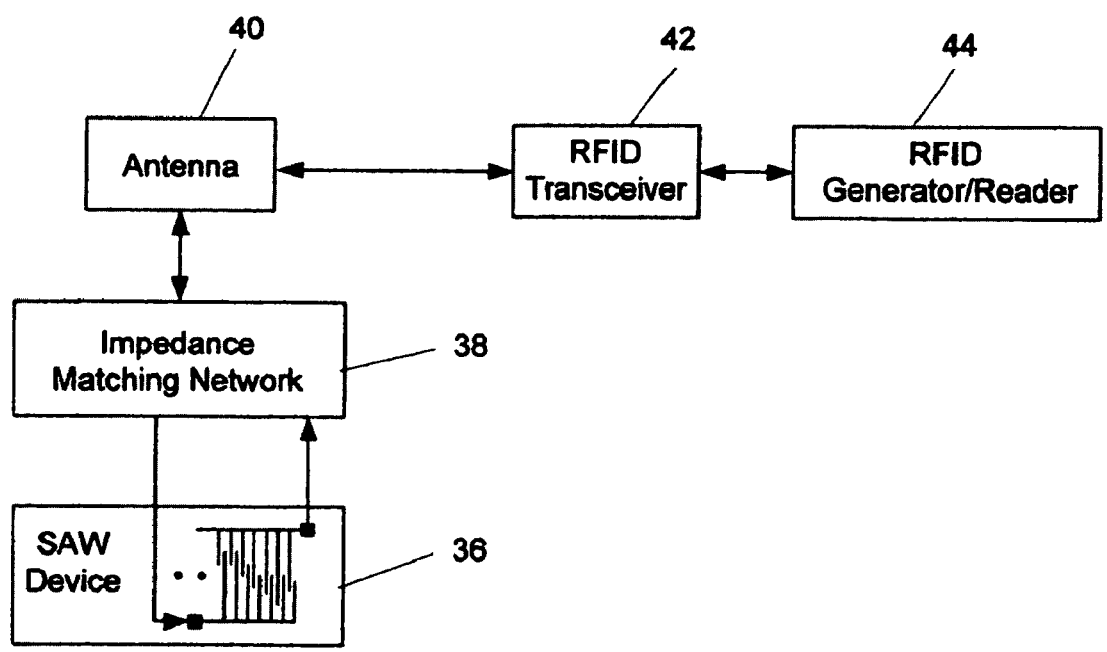
FIG. 7 is a schematic diagram illustrating the operational functions of the piezoelectric device package when operated with an external RFID transceiver and RFID generator/reader as constructed in accordance with an embodiment of the invention.

FIG. 7 is a schematic diagram illustrating the operational functions of an embodiment of the invention the piezoelectric device package when operated with an external RFID. The surface acoustic wave (SAW) or other piezoelectric device 36 is wired through an impedance matching network 38 to an antenna 40 to obtain the desired operating frequency. In operation, the antenna communicates by means of an external RFID transceiver 42 with an external RFID signal generator/reader 44 generally located at the top of a well bore to provide tag information for tracking and maintaining an inventory of tools being lowered into and raised from a well.

By mounting various types of known piezoelectric devices in the piezoelectric device packages comprising embodiments of the invention, which are able to withstand pressures up to 25,000 psi and temperatures up to 300° C., piezoelectric devices can be installed in cavities of various tools, pipe, and other equipment for tagging equipment used in downhole or other extreme environment applications. Utilization of embodiments of the invention results in better means of tracking and maintaining records regarding the massive amounts of tools and equipment used in the oil and gas industry, thereby yielding considerable financial benefits.

Although the invention has been described with reference to illustrative embodiments, the foregoing description is not intended to limit the scope of the invention. Various modifications and combinations of the illustrative embodiments as well as other embodiments of the invention will be apparent to persons skilled in the art upon reference to the description. It is therefore intended that the appended claims incorporate any such modifications or embodiments.

The invention claimed is:

1. A high pressure piezoelectric packaging system comprising:
   a piezoelectric device package comprising an RFID device;
   a device header contained inside said piezoelectric device package;
   a piezoelectric device mounted inside said device header;
   a bottom lid hermetically sealed to said device header;
   an antenna further inside said piezoelectric device package;
   an impedance matching network mounted inside said piezoelectric device package;
   said impedance matching network being wired between said piezoelectric device and said antenna; and
   an outer radome protective cover;
   said radome protective cover further having a means for securing said piezoelectric device package in a tool cavity.

2. The device package of claim 1, wherein said piezoelectric device is used for tagging various tools.

3. The device package of claim 2, wherein said RFID device is a surface acoustic wave (SAW) device mounted inside said device header.

4. The device package of claim 2, wherein said RFID device is a bulk acoustic wave (BAW) device mounted inside said device header.

* * * * *